(12) United States Patent
Inami

(10) Patent No.: US 6,205,054 B1
(45) Date of Patent: Mar. 20, 2001

(54) NONVOLATILE MEMORY

(75) Inventor: Nobuo Inami, Tokyo (JP)

(73) Assignee: Global Alliance Inc., Tokyo (JP)

( * ) Notice: Subject to any disclaimer, the term of this patent is extended or adjusted under 35 U.S.C. 154(b) by 0 days.

(21) Appl. No.: 09/459,568

(22) Filed: Dec. 13, 1999

(30) Foreign Application Priority Data

Dec. 14, 1998 (JP) .................................................. 10-355017

(51) Int. Cl.[7] .................................................. G11C 16/04
(52) U.S. Cl. .............................. 365/185.05; 365/185.01; 365/185.24; 365/185.18; 365/185.14
(58) Field of Search .................. 365/185.01, 185.24, 365/185.14, 185.18, 185.05

(56) References Cited

U.S. PATENT DOCUMENTS

| 5,604,711 | * | 2/1997 | Cheung | 365/230.06 |
|---|---|---|---|---|
| 5,608,670 | * | 3/1997 | Akaogi et al. | 365/185.23 |
| 5,751,635 | * | 5/1998 | Wong et al. | 365/185.19 |
| 5,757,696 | * | 5/1998 | Matsuo et al. | 365/185.07 |
| 5,912,488 | * | 6/1999 | Kim et al. | 257/316 |

FOREIGN PATENT DOCUMENTS

| 353125736A | * | 11/1978 | (JP) . |
| 403216896A | * | 9/1991 | (JP) . |
| 410125071A | * | 5/1998 | (JP) . |

* cited by examiner

Primary Examiner—Viet Q. Nguyen
(74) Attorney, Agent, or Firm—Huntley & Associates

(57) ABSTRACT

A nonvolatile memory includes paired memory elements each including a storage transistor having a control gate and a floating gate. Through a write operation, one of the storage transistors is brought into a depletion state and the other storage transistor is brought into an enhancement state. Subsequently, a connection transistor is operated in order to serially connect the paired memory elements. As result, a binary signal corresponding to the statuses of the paired storage transistors is outputted.

9 Claims, 4 Drawing Sheets

NONVOLATILE MEMORY

BACKGROUND OF THE INVENTION

1. Field of the Invention

The present invention relates to a nonvolatile memory, and more particularly to a nonvolatile memory, such as EPROM or EEPROM, which is preferably used in applications which require a static readout operation (e.g., an application which requires static data output).

2. Description of the Related Art

Many conventional nonvolatile memories have employed a dynamic circuit for data readout operation, and therefore have suffered from a problem of high electric power consumption due to static current. Particularly, such nonvolatile memories consume a considerably large amount of electric power when a readout operation is performed continuously or data are output statically.

Some SRAMs employ six-transistor cells in order to decrease static current to 1 μA or less. However, conventional nonvolatile memories such as EPROMs and EEPROMs have had a drawback of large static current and therefore cannot be used in applications in which continuous a readout operation must be performed.

SUMMARY OF THE INVENTION

In view of the foregoing, an object of the present invention is to provide a nonvolatile memory which can maintain static current at a very low level even while in a readout state.

In order to achieve the above object, the present invention provides a nonvolatile memory comprising: paired memory elements each including a storage transistor having a control gate and a floating gate, in which, through a write operation, one of the storage transistors is brought into a depletion state and the other storage transistor is brought into an enhancement state; and connection means for serially connecting the paired memory elements during at least a readout operation, wherein an output signal is outputted from a connection line which connects the paired memory elements via the connection means.

Preferably, the connection means comprises switch means for serially connecting the paired memory elements during the readout operation.

Alternatively, the connection means comprises paired connection transistors, each of which shares at least the floating gate with the corresponding storage transistor and which are connected in series.

Preferably, each of the memory elements comprises a write transistor connected in series to the storage transistor.

In the nonvolatile memory according to the present invention, current other than leakage current does not flow during readout operation. Therefore, nonvolatile memories—which have conventionally consumed a large amount of electric power due to static current and therefore have been used in limited applications—can be applied to a broadened range of applications. Further, the nonvolatile memory of the present invention can be applied even to applications which require static data output.

In ordinary memory, since voltage written into a memory element is insatiable, a dedicated sense amplifier must be provided in order to stabilize the voltage. Further, the sense amplifier is operated during a readout operation only in order to reduce electric power consumed in the sense amplifier. In contrast, in the present invention, since the memory element itself outputs a memorized signal, such a sense amplifier is not required. This reduces consumption of electric power and simplifies the overall structure of a memory unit.

BRIEF DESCRIPTIONS OF THE DRAWINGS

DESCRIPTION OF PREFERRED EMBODIMENTS

Embodiments of the present invention will be described in detail with reference to the drawings.

Figure 1:
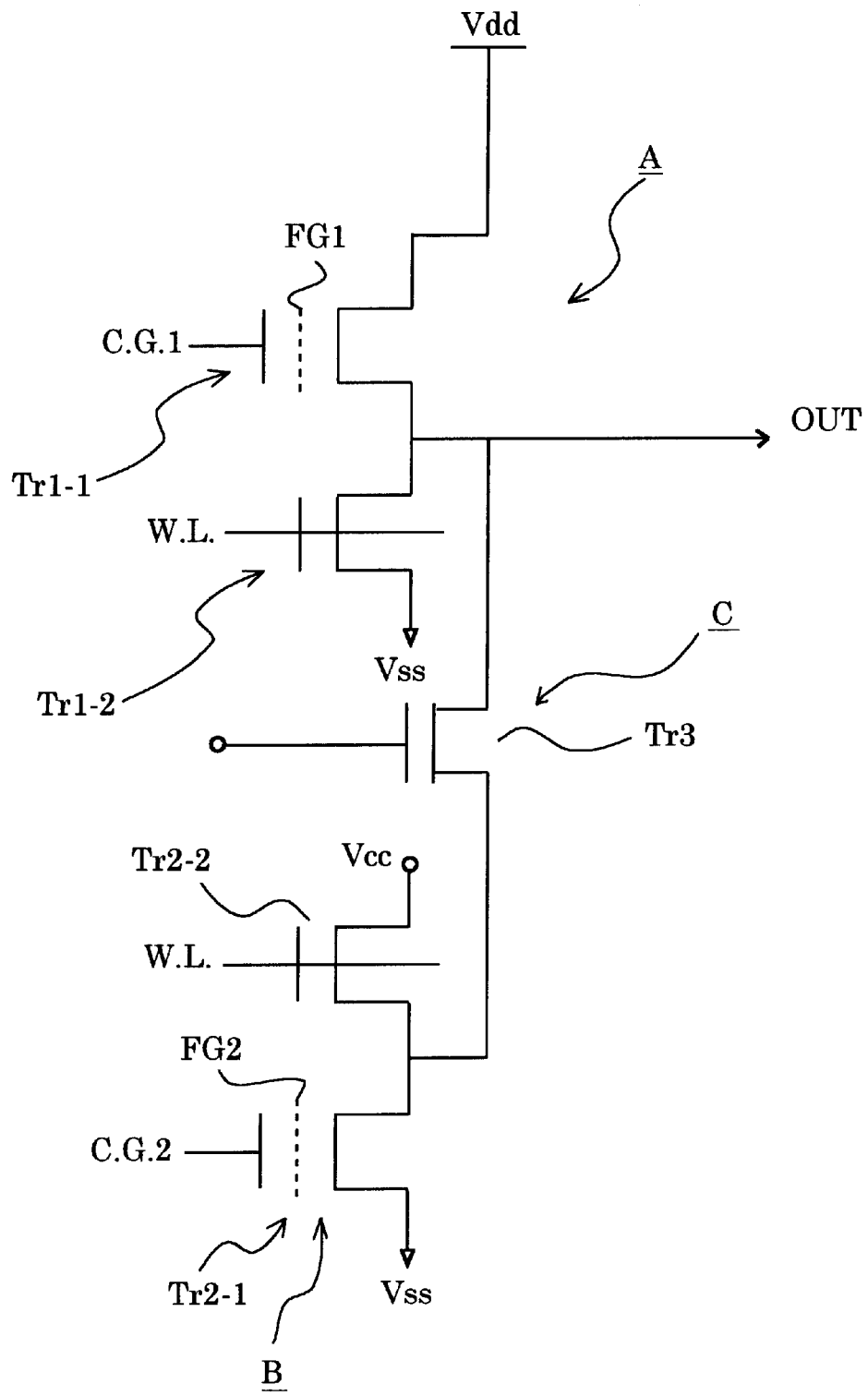
FIG. 1 is a circuit diagram of a 1-bit nonvolatile memory according to a first embodiment of the present invention.

FIG. 1 is a circuit diagram of a 1-bit nonvolatile memory according to a first embodiment of the present invention. As shown in FIG. 1, the nonvolatile memory comprises two memory elements A and B. The memory element A comprises a storage transistor Tr1-1 having a control gate CG1 and a floating gate FG1, and a write transistor Tr1-2 connected in series to the common side (Vss side) of the storage transistor Tr1-1. Similar to the memory element A, the memory element B comprises a storage transistor Tr2-1 having a control gate CG2 and a floating gate FG2, and a write transistor Tr2-2 connected in series to the storage transistor Tr2-1. However, the memory element B differs in configuration from the memory element A in that the write transistor Tr2-2 is connected to the power-source side (Vdd side) of the storage transistor Tr2-1.

Connecting means C according to the present embodiment is adapted to mutually connect the memory elements A and B in series. Specifically, the storage transistors Tr1-1 and Tr2-1 are connected with each other via a switching transistor Tr3 serving as a switch means. In this case, an output OUT is obtained from a connection line which establishes connection between the memory elements A and B. In FIG. 1, the output OUT is obtained from the connection line on the drain side of the switching transistor Tr3.

In the case where the storage transistors Tr1-1 and Tr2-1 of the nonvolatile memory are of NMOS, write operation is performed as follows. In order to bring the level of the output to a "1" level, the switching transistor Tr3 is first turned off in order to break the serial connection between the memory elements A and B. In this state, the storage transistor Tr1-1 of the memory element A on the power-source side (Vdd side) is brought into a depletion mode, and the storage transistor Tr2-1 of the memory element B on the common side (Vss side) is brought into an enhancement mode. Subsequently, the switching transistor Tr3 is turned on so as to establish serial connection between the memory elements A and B. As a result, the output OUT assumes the "1" level. When the write operation is performed in such a manner that the storage transistor Tr1-1 is brought into an enhancement mode and the storage transistor Tr2-1 is brought into a depletion mode, the output OUT assumes a "0" level. As described above, in the case where the nonvolatile memory is of a single bit type, the serially connected memory elements A and B are not brought into the same mode but are brought into different modes during the writing operation.

In such an enhancement mode, the threshold voltage Vth increases to a value close to or greater than the power-source voltage Vdd. In ordinary EEPROMs, FN current (tunnel current) is used in order to bring the storage transistor into an enhancement mode. That is, when the nonvolatile memory is of NMOS type, a high voltage (typically, about 15V) is applied to the control gates CG1 and CG2 of the storage transistors Tr1-1 and Tr2-1, and the operation voltage of an injector is set to become equal to the common voltage Vss. Specifically, while a high voltage is applied to control gates CG1 and CG2, either the write transistor Tr1-2 or Tr2-2 is turned on. As a result, electrons are injected from the injector into the floating gate FG1 of the storage transistor Tr1-1 or the floating gate FG2 of the storage transistor Tr2-1 which is connected to the activated write transistor, so that the corresponding storage transistor has an elevated threshold voltage Vth, and thus comes into an enhancement mode. The threshold voltage Vth may be set to an arbitrary value through control of the length of the injection time. Typically, the threshold voltage Vth increases to 5V or greater through an injection of over 100 msec.

In contrast, in order to cause the storage transistor to have a lowered threshold voltage Vth and thus come into a depletion mode, electrons are removed from the floating gates FG1 and FG2. For example, the operation voltage of the injector is increased to a high voltage (typically, about 15V), and the common voltage Vss is applied to control gates CG1 and CG2.

In the nonvolatile memory having the above-described configuration, the switching transistor Tr3 is turned on after the write operation. When the storage transistor Tr1-1 has an elevated threshold voltage Vth and the storage transistor Tr2-1 has a lowered threshold voltage Vth, the potential of the output OUT becomes equal to the power-source voltage Vdd. In this case, no current (other than a weak leakage current) flows through the storage transistor Tr2-1.

In contrast, when the storage transistor Tr2-1 has an elevated threshold voltage Vth and the storage transistor Tr1-1 has a lowered threshold voltage Vth, the potential of the output OUT becomes equal to the common voltage vss. In this case as well, no current (other than a weak leakage current) flows through the storage transistor Tr1-1.

As has been described, in the nonvolatile memory according to the present invention, other than leakage current, no current flows through the memory during the read operation (when the output is fixed).

Figure 2:
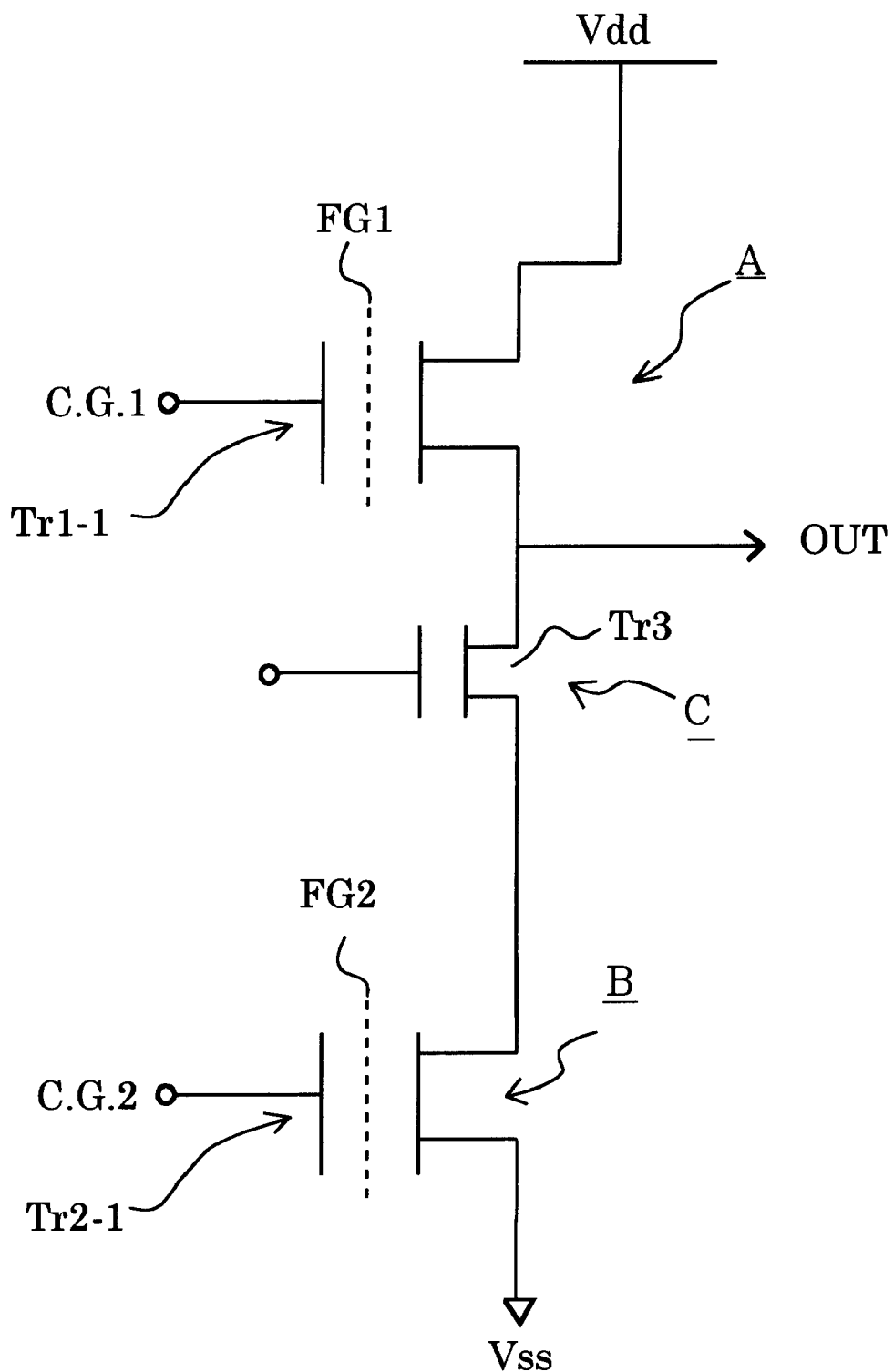
FIG. 2 is a circuit diagram of a 1-bit nonvolatile memory according to a second embodiment of the present invention.

The configuration of the above-described embodiment can be simplified through omission of the write transistors Tr1-2 and Tr2-2, when the memory elements A and B are configured to eliminate the necessity of selecting either one of the storage transistors Tr1-1 and Tr2-1 by the write transistors Tr1-2 and Tr2-2. FIG. 2 shows a 1-bit nonvolatile memory according to a second embodiment of the present invention having such a simplified structure. In both write and read periods, the nonvolatile memory according to the present embodiment operates in the same manner as the embodiment shown in FIG. 1, except that the write operation is performed individually for the storage transistor Tr1-1 of the memory element A and the storage transistor Tr2-1 of the memory element B.

Figure 3:
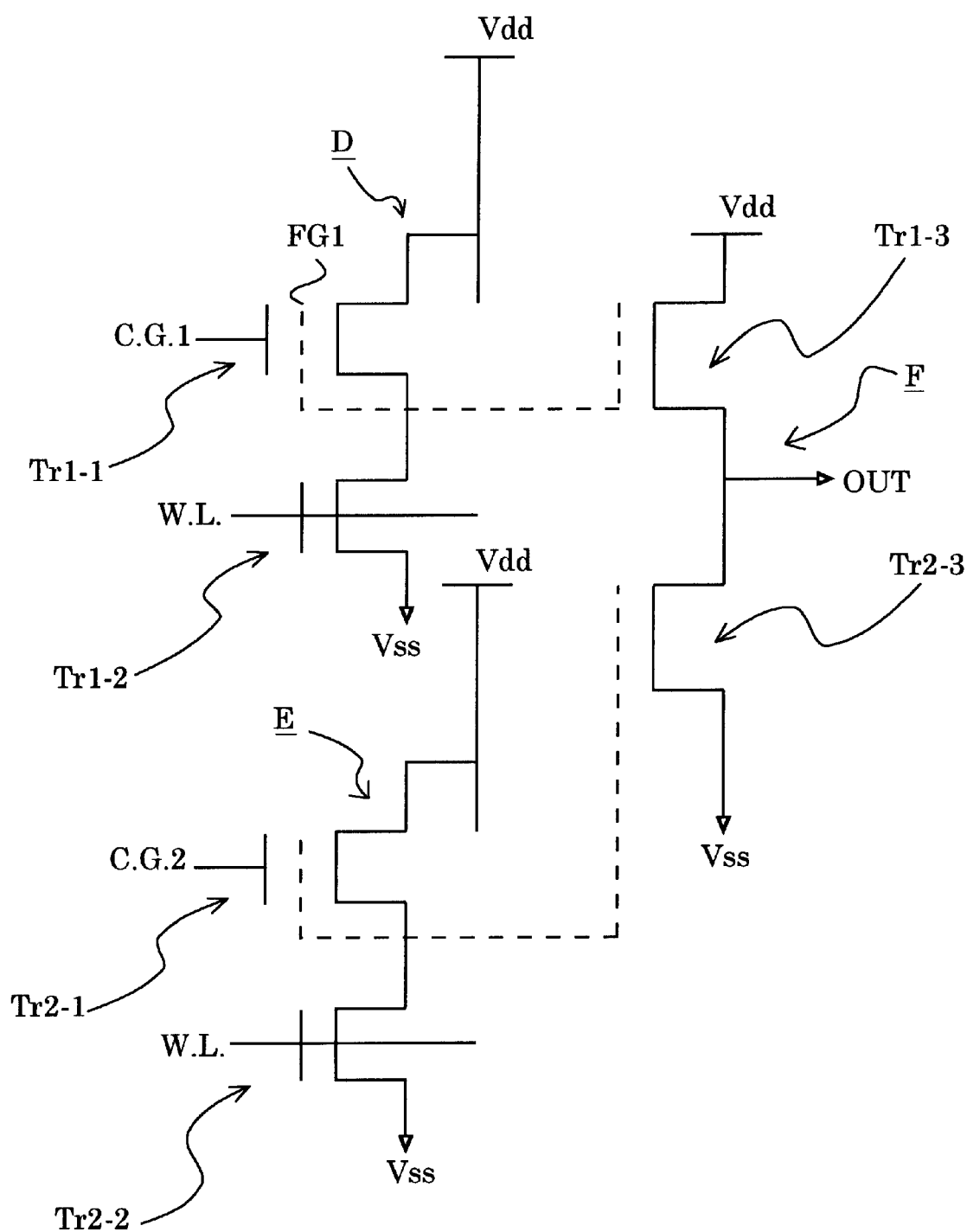
FIG. 3 is a circuit diagram of a 1-bit nonvolatile memory according to a third embodiment of the present invention.
Figure 4:
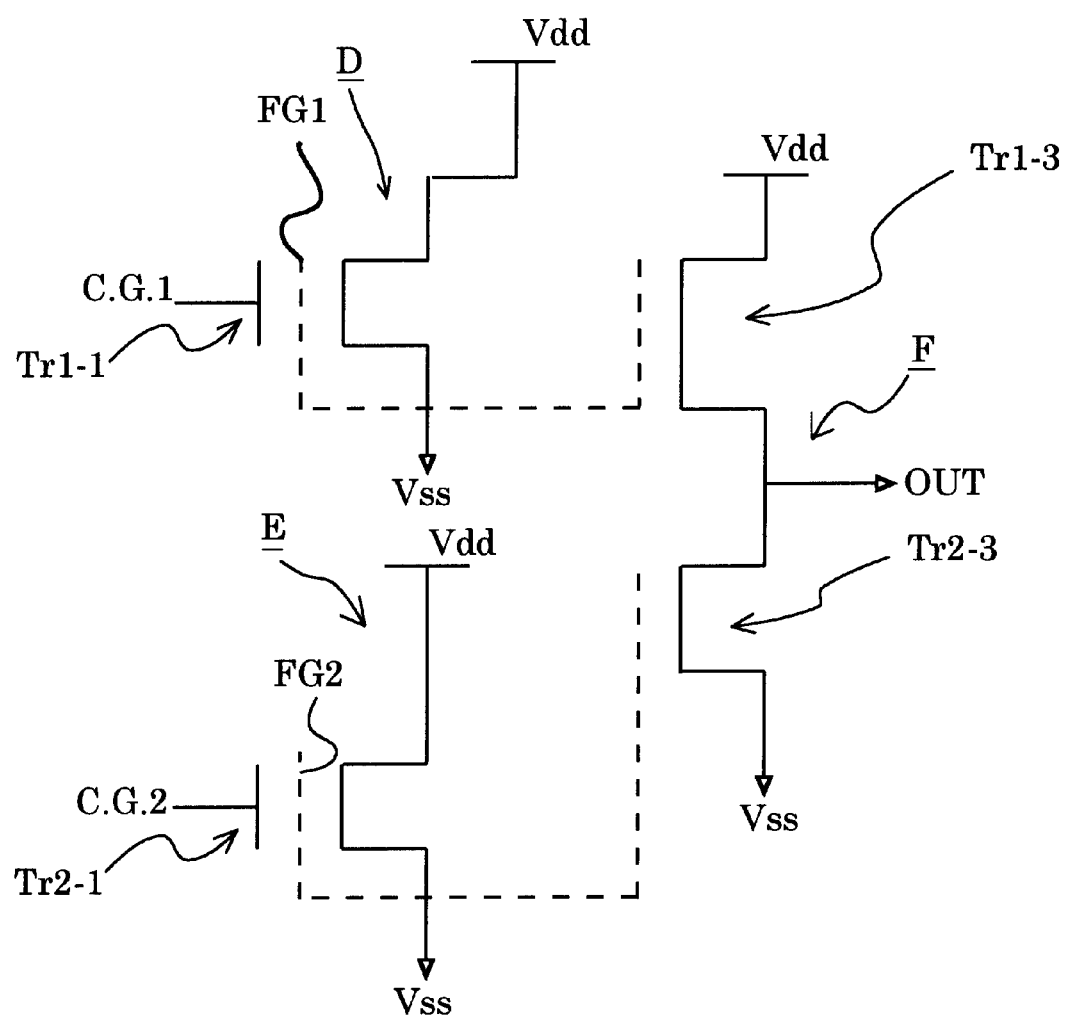
FIG. 4 is a circuit diagram of a 1-bit nonvolatile memory according to a fourth embodiment of the present invention.

In the nonvolatile memories shown in FIGS. 1 and 2, the connection means C for connecting the memory elements A and B is composed of a switching transistor Tr3 serving as a switching means. However, in the third and fourth embodiments of the present invention, the connection means differs in configuration. The third and fourth embodiments will be described with reference to FIGS. 3 and 4. In FIGS. 3 and 4, elements functionally corresponding to those of the nonvolatile memories shown in FIGS. 1 and 2 are denoted by the same reference characters, and their descriptions are omitted so as to avoid redundancy.

As shown in FIG. 3, the nonvolatile memory of the present embodiment comprises two memory elements D and E and connection means F. The memory element D comprises a storage transistor Tr1-1 having a control gate CG1 and a floating gate FG1, and a write transistor Tr1-2 connected in series to the storage transistor Tr1-1. The memory element E has the same configuration as the memory element D. Specifically, the memory element E comprises a storage transistor Tr2-1 having a control gate CG2 and a floating gate FG2, and a write transistor Tr2-2 connected in series to the storage transistor Tr2-1.

The connection means F of the present embodiment functions to serially connect the memory elements D and E. Specifically, the connection means F comprises two connection transistors Tr1-3 and Tr2-3 which are mutually connected in series. The connection transistors Tr1-3 and Tr2-3 share the floating gates FG1 and FG2 with the storage transistors Tr1-1 and Tr2-1, and are controlled by the control gates CG1 and CG2. In this manner, the pair comprising the storage transistor Tr1-1 and the connection transistor Tr1-3 and the pair comprising the storage transistor Tr2-1 and the connection transistor Tr2-3 are configured such that the pairs always assume the same state. That is, when the storage transistor Tr1-1 comes into an enhancement state or depletion state, the connection transistor Tr1-3 comes into the same state. The same relationship exists between the storage transistor Tr2-1 and the connection transistor Tr2-3. The output OUT is obtained from a connection line between the connection transistors Tr1-3 and Tr2-3 of the connection means F.

In the case where the storage transistors Tr1-1 and Tr2-1 and the connection transistors Tr1-3 and Tr2-3 are of NMOS, a write operation is performed as follows. In order to bring the level of the output to a "1" level, the storage transistor Tr1-1 of the memory element D and the connection transistor Tr1-3 of the connection means F, which are all located on the power-source side (Vdd side), are brought into a depletion mode, and the storage transistor Tr2-1 of the memory element E and the connection transistor Tr2-3 of the connection means F, which are all located on the common side (Vss side), are brought into an enhancement mode. In contrast, in order to bring the level of the output to a "0" level, the storage transistor Tr1-1 of the memory element D and the connection transistor Tr1-3 of the connection means F are brought into an enhancement mode, and the storage transistor Tr2-1 of the memory element E and the connection transistor Tr2-3 of the connection means F are brought into a depletion mode. As described above, in the case where the nonvolatile memory is of a single bit type, the serially connected memory elements D and E are not brought into the same mode but are brought into different modes during the writing operation.

In such an enhancement mode, as in the embodiment shown in FIG. 1, the threshold voltage Vth increases to a value close to or greater than the power-source voltage Vdd. That is, while a high voltage is applied to the control gates CG1 and CG2, either the write transistor Tr1-2 or the write transistor Tr2-2 is turned on. As a result, electrons are injected from the injector into the floating gate FG1 of the storage transistor Tr1-1 or the floating gate FG2 of the storage transistor Tr2-1 which is connected to the activated write transistor, so that the corresponding storage transistor has an elevated threshold voltage Vth, and thus comes into an enhancement mode. The threshold voltage Vth may be set to an arbitrary value through control of the length of the injection time.

In contrast, in order to cause the storage transistor to have a lowered threshold voltage Vth and thus come into a depletion mode, electrons are removed from the floating gates FG1 and FG2, as in the embodiment shown in FIG. 1.

In the nonvolatile memory having the above-described configuration, when each of the storage transistors Tr1-1 and the connection transistors Tr1-3 has an elevated threshold voltage Vth, each of the storage transistors Tr2-1 and the connection transistors Tr2-3 has a lowered threshold voltage Vth, so that the potential of the output OUT becomes equal to the power-source voltage Vdd. In this case, no current (other than a weak leakage current) flows through the storage transistor Tr2-1 and the connection transistor Tr2-3.

In contrast, when each of the storage transistors Tr2-1 and the connection transistors Tr2-3 has an elevated threshold voltage Vth, each of the storage transistors Tr1-1 and the connection transistors Tr1-3 has a lowered threshold voltage Vth, so that the potential of the output OUT becomes equal to the common voltage Vss. In this case, no current (other than a weak leakage current) flows through the storage transistor Tr1-2 and the connection transistor Tr1-3.

As has been described, in the nonvolatile memory according to the present invention, other than leakage current, no current flows through the memory during the read operation (when the output is fixed).

The configuration of the above-described embodiment can be simplified through omission of the write transistors Tr1-2 and Tr2-2, as in the case of the nonvolatile memory shown in FIG. 2. FIG. 4 shows a 1-bit nonvolatile memory according to a fourth embodiment of the present invention having such a simplified structure. The nonvolatile memory according to the present embodiment is configured such that each of the memory elements D and E is formed of a single storage transistor Tr1-1 or Tr2-1 and corresponds to the embodiment shown in FIG. 2. In both write and read periods, the nonvolatile memory according to the present embodiment operates in the same manner as the embodiment shown in FIG. 3, except that the write operation is performed independently for the storage transistor Tr1-1 of the memory element D and the storage transistor Tr2-1 of the memory element E.

All the nonvolatile memories according to the embodiments shown in FIGS. 1–4 are of single bit type. However, needless to say, a plurality of the nonvolatile memories may be connected in parallel in order to form a nonvolatile memory having a desired number of bits. Further, the memory elements A, B, C, and D may be formed of PMOS. Even when the memory elements A, B, C, and D are formed of PMOS, similar action and effects are obtained although the logic of operation reverses.

What is claimed is:

1. A nonvolatile memory comprising:

paired memory elements each including a storage transistor having a control gate and a floating gate; and connection means for serially connecting said paired memory elements during at least a readout operation, an output signal being output from a connection line which connects said paired memory elements via said connection means, wherein the state of each storage transistor is switchable between enhancement and depletion states through charging of electrons into the floating gate and discharge of electrons from the floating gate; and one storage transistor is brought into an enhancement state, and the other storage transistor is brought into a depletion state, through a write operation.

2. A nonvolatile memory according to claim 1, wherein said storage transistors are the same conduction type.

3. A nonvolatile memory according to claim 2, wherein said storage transistors are formed of NMOS or PMOS.

4. A nonvolatile memory according to claim 1, wherein said connection means comprises switching means for serially connecting said paired memory elements during the readout operation.

5. A nonvolatile memory according to claim 1, wherein each of said memory elements comprises a write transistor connected in series to said storage transistor.

6. A nonvolatile memory according to claim 4, wherein each of said memory elements comprises a write transistor connected in series to said storage transistor.

7. A nonvolatile memory according to claim 1, wherein said connection means comprises paired connection transistors, each of which shares at least the floating gate with the corresponding storage transistor and which are connected in series.

8. A nonvolatile memory according to claim 7, wherein each of said memory elements comprises a write transistor connected in series to said storage transistor.

9. A nonvolatile memory according to claim 1, wherein the threshold value of said storage transistor to be brought into the enhancement state is set to a level close to or greater than a power-source voltage.

* * * * *